(12) United States Patent
Mallat

(10) Patent No.: US 11,789,708 B2
(45) Date of Patent: Oct. 17, 2023

(54) COMPRESSION OF FIRMWARE UPDATES

(71) Applicant: Silicon Laboratories Inc., Austin, TX (US)

(72) Inventor: Hannu Mallat, Hyvinkää (FI)

(73) Assignee: Silicon Laboratories Inc., Austin, TX (US)

( * ) Notice: Subject to any disclaimer, the term of this patent is extended or adjusted under 35 U.S.C. 154(b) by 111 days.

(21) Appl. No.: 17/237,538

(22) Filed: Apr. 22, 2021

(65) Prior Publication Data
US 2022/0350576 A1 Nov. 3, 2022

(51) Int. Cl.
*G06F 8/40* (2018.01)
*H03M 7/30* (2006.01)
*G06F 8/65* (2018.01)

(52) U.S. Cl.
CPC ............ *G06F 8/40* (2013.01); *G06F 8/65* (2013.01); *H03M 7/3059* (2013.01); *H03M 7/3088* (2013.01)

(58) Field of Classification Search
CPC ............ G06F 8/40; G06F 8/65; G06F 8/71
See application file for complete search history.

(56) References Cited

U.S. PATENT DOCUMENTS

| | | | |
|---|---|---|---|
| 8,468,516 B1 * | 6/2013 | Chen | G06F 8/656 717/169 |
| 2003/0212712 A1 * | 11/2003 | Gu | G06F 16/10 |
| 2019/0034195 A1 * | 1/2019 | Pirvu | G06F 12/0638 |

OTHER PUBLICATIONS

Percival, "Naïve Differences of Executable Code", Computing Lab, Oxford University, Aug. 2003.
The Chromium Projects, "Software Updates: Courgette", https://www.chromium.org/developers/design-documents/software-updates-courgette, Dec. 2009.

* cited by examiner

*Primary Examiner* — Duy Khuong T Nguyen
(74) *Attorney, Agent, or Firm* — NIELDS, LEMACK & FRAME, LLC

(57) ABSTRACT

A system and method for creating firmware patch files is disclosed. The method utilizes the Executable Linkable Format file that is created when the firmware image is created. By analyzing the ELF file, the patch creation software is able to identify functions and other data in the new firmware image. The patch creation software then compares these functions to corresponding functions in the old firmware image. The method then creates an edit sequence that may be used to transform the old firmware image into the new firmware image. The edit sequence is then converted into a series of opcodes, where each opcode is followed by at least one parameter. A patch program, disposed on a network device, is able to apply the patch file to update its firmware. This method creates a smaller patch file than other popular tools.

19 Claims, 5 Drawing Sheets

```
0000bab4 <initApp>:
 bab4:   b510         push   {r4, lr}
 bab6:   f003 fdbd    bl     f634 <configEnablePti>
 baba:   2300         movs   r3, #0
 babc:   2204         movs   r2, #4
 babe:   210a         movs   r1, #10
 bac0:   2001         movs   r0, #1
 bac2:   f006 f949    bl     11d58 <GPIO_PinModeSet>
 bac6:   2301         movs   r3, #1
 bac8:   2204         movs   r2, #4
 baca:   210f         movs   r1, #15
 bacc:   2003         movs   r0, #3
 bace:   e8bd 4010    ldmia.w sp!, {r4, lr}
 bad2:   f006 b941    b.w    11d58 <GPIO_PinModeSet>
```

FIG. 4A

```
[0x0000bab4]: symbol 'initApp' of 34 bytes
symbol 'initApp' (34 bytes): matches 'initApp' (34 bytes), distance 3
------ 'initApp' ------                                                    ......#."......
0000bab4: 10 b5 03 f0 bd fd 00 23 04 22 0a 21 01 20 06 f0    I..#."......@..
0000bac4: 49 f9 01 23 04 22 0f 21 03 20 bd e8 10 40 06 f0    A.
0000bad4: 41 b9
```

FIG. 4B

```
------ 'initApp' ------                                                    ......#."......
0000bab4: 10 b5 03 f0 a7 fd 00 23 04 22 0a 21 01 20 06 f0    7..#."......@..
0000bac4: 37 f9 01 23 04 22 0f 21 03 20 bd e8 10 40 06 f0
0000bad4: 2f b9
```

FIG. 4C

COMPRESSION OF FIRMWARE UPDATES

This disclosure describes systems and methods for compressing firmware updates, especially for devices that communicate using a low bandwidth network.

BACKGROUND

Many devices that include programmable processors benefit from software or firmware updates. For example, updates are useful when new features are developed or issues with the current revision are addressed. These updates were initially targeted at computers, such as servers, desktop computers, and laptop computers. However, over time, more devices are utilizing these upgrades. For example, the operating system for mobile phones, as well as the applications resident on that mobile phone, are commonly updated.

In certain embodiments, the devices to be updated communicate over a low bandwidth network. In these embodiments, the size of the firmware or software update is critical, as a large update may utilize an unacceptable amount of network bandwidth.

Rather than transmitting an entire software image, many programs transmit only the differences between the previous version and the updated version. The idea is that for an update, the software does not change much between versions, compared to a new major release, so the delta is small compared to the full image. It would then be advantageous to transmit only the delta and construct the new image at the recipient by applying the delta to the old image. In this manner, compression of an order of magnitude (i.e., 10% of the full binary size) is achievable. The file containing the differences and any processing instructions needed to produce the new binary file from the old binary file and the differences is typically called a patch file, and the act of constructing the new binary file is typically called applying a patch.

There are several software programs that are commonly used to create these firmware patch files. For example, bsdiff is a program commonly used to create and apply patches to binary files. Google has also created a compression algorithm known as Courgette that reduces the size of Google Chrome updates.

While these compression algorithms exist, there is still an unmet need for a new method for creating and applying firmware patches.

For example, Bluetooth defines a mesh protocol that has sustained bandwidth of less than 10 kilobytes per second. At these bandwidths, reduction of the size of the firmware patch file is critical. Further, in the case of an embedded system, the available resources, such as computation speed, and available memory, is much scarcer than on other devices, such as personal computers.

Therefore, it would be beneficial if there was a system and method for compressing and applying patches to remote devices, especially those comprising embedded systems connected wirelessly over a low bandwidth network.

SUMMARY

A system and method for creating firmware patch files is disclosed. The method utilizes the Executable Linkable Format file that is created when the firmware image is created. By analyzing the ELF file, the patch creation software is able to identify functions and other data in the new firmware image. The patch creation software then compares these functions to corresponding functions in the old firmware image. The method then creates an edit sequence that may be used to transform the old firmware image into the new firmware image. The edit sequence is then converted into a series of opcodes, where each opcode is followed by at least one parameter. A patch program, disposed on a network device, is able to apply the patch file to update its firmware. This method creates a smaller patch file than other popular tools.

According to one embodiment, a method of creating a patch file that transforms an old firmware image into a new firmware image is disclosed. The method comprises analyzing an ELF (Executable Linkable Format) file associated with the new firmware image to identify functions within the new firmware image; matching a function in the new firmware image with a corresponding function in the old firmware image; identifying differences between the function in the new firmware image and the corresponding function in the old firmware image; creating an edit sequence based on the differences; converting edit sequence to a set of opcodes, each opcode comprising at least one parameter; and repeating the matching, identifying, creating and converting steps for each function in the new firmware image. In certain embodiments, matching the function comprises: identifying a name of the function from the ELF file and finding an identical name in the ELF file associated with the old firmware image. In some embodiments, matching the function comprises: finding a Levenshtein edit distance between the function in the new firmware image and each function in the old firmware image; and selecting a function in the old firmware image having the shortest Levenshtein edit distance. In certain embodiments, matching the function comprises: determining a Hamming distance between the function in the new firmware image and all functions in the old firmware image having a same length; and selecting a function in the old firmware image having the shortest Hamming distance. In certain embodiments, creating the edit sequence comprises: calculating a Wagner-Fischer matrix between the function in the new firmware image and the corresponding function in the old firmware image; and creating a sequence of edit steps based on the matrix. In some embodiments, the edit steps are selected from the group consisting of no change, add, substitute, and delete. In some embodiments, the set of opcodes is selected from the group consisting of substitute (SUB), add (ADD), skip (SKIP), delete (DEL), set (SET), diff (DIFF), and copy (COPY). In some embodiments, the DIFF opcode replaces a data entity in the old firmware image with a new value, that is defined relative to the data entity in the old firmware image. In certain embodiments, opcode length is determined based on frequency of occurrence in the patch file. In some embodiments, the method further comprises locating, in the new firmware image, regions that is not functions, the regions including padding, object symbols, read only data, and other binary data. In certain embodiments, the ELF files are used to locate an object symbol in the new firmware image and a corresponding object symbol in the old firmware image, and the object symbol and corresponding object symbol are compared to identify differences and the differences are used to create the edit sequence. In some embodiments, read only data and other binary data is compared by finding longest common substrings (LCS) to locate similarities, and the longest common substrings are used to create edit sequences, and the edit sequences are converted to the set of opcodes. In certain embodiments, a length of the read only data and other binary data in the new firmware image is compared to a length of the read only data and other binary data in the old firmware image and if the lengths are identical, a Hamming edit distance is determined, and if the Hamming edit distance is small, an edit sequence is generated. In some embodiments, if the Hamming edit distance is large, an entirety of the read only data and other binary data is substituted in the patch file. In some embodiments, the patch file further comprises a dictionary comprising a plurality of entries, and the at least one parameter that follows one or more of the opcodes in the set of opcodes is used to access an entry in the dictionary. In some embodiments, the at least one parameter comprises a pointer to index into a list of addresses, and the addresses are used to identify a location within the dictionary. In certain embodiments, the dictionary is organized according to a length of each entry such that a first number of entries are reserved for values that are a first length and a second number of entries are reserved for values that are a second length.

BRIEF DESCRIPTION OF THE DRAWINGS

For a better understanding of the present disclosure, reference is made to the accompanying drawings, in which like elements are referenced with like numerals, and in which:

FIG. 4A shows a representative function;

FIG. 4B shows the binary representation of this function in the old firmware image;

FIG. 4C shows the binary representation of this function in the new firmware image.

DETAILED DESCRIPTION

Figure 1:
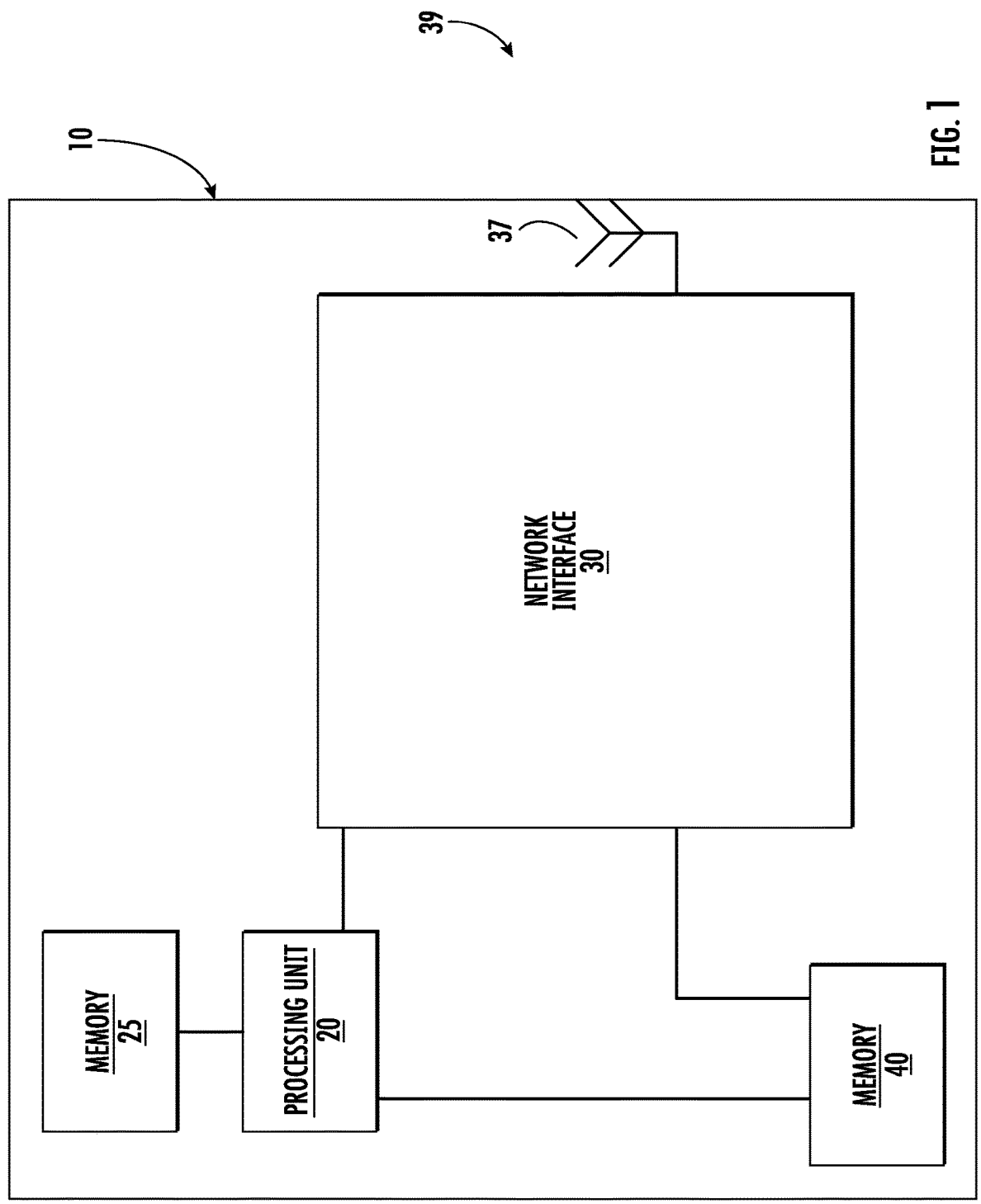
FIG. 1 is a block diagram of a network device that may be used to apply the firmware patch.

FIG. 1 shows a network device that may be used to apply a firmware patch file. This firmware patch file may be transmitted via a wireless network.

The network device 10 has a processing unit 20 and an associated memory device 25. The processing unit 20 may be any suitable component, such as a microprocessor, embedded processor, an application specific circuit, a programmable circuit, a microcontroller, or another similar device. The memory device 25 contains the instructions, which, when executed by the processing unit 20, enable the network device 10 to perform the functions described herein. This memory device 25 may be a non-volatile memory, such as a FLASH ROM, an electrically erasable ROM or other suitable devices. In other embodiments, the memory device 25 may be a volatile memory, such as a RAM or DRAM. The instructions contained within the memory device 25 may be referred to as a software program, which is disposed on a non-transitory storage media.

The network device 10 also includes a network interface 30, which may be a wireless network interface that includes an antenna 37. The network interface 30 may support any wireless network protocol that supports a firmware update protocol, such as Bluetooth and Bluetooth Mesh. The network interface 30 is used to allow the network device 10 to communicate with other devices disposed on the network 39.

The network device 10 may include a second memory device 40. Data that is received from the network interface 30 or is to be sent via the network interface 30 may also be stored in the second memory device 40. This second memory device 40 is traditionally a volatile memory.

While a memory device 25 is disclosed, any computer readable medium may be employed to store these instructions. For example, read only memory (ROM), a random access memory (RAM), a magnetic storage device, such as a hard disk drive, or an optical storage device, such as a CD or DVD, may be employed. Furthermore, these instructions may be downloaded into the memory device 25, such as for example, over the network connection, via CD ROM, or by another mechanism. These instructions may be written in any programming language, which is not limited by this disclosure. Thus, in some embodiments, there may be multiple computer readable non-transitory media that contain the instructions described herein. The first computer readable non-transitory media may be in communication with the processing unit 20, as shown in FIG. 1. The second computer readable non-transitory media may be a CDROM, or a different memory device, which is located remote from the network device 10. The instructions contained on this second computer readable non-transitory media may be downloaded onto the memory device 25 to allow execution of the instructions by the network device 10.

While the processing unit 20, the memory device 25, the network interface 30 and the second memory device 40 are shown in FIG. 1 as separate components, it is understood that some or all of these components may be integrated into a single electronic component. Rather, FIG. 1 is used to illustrate the functionality of the network device 10, not its physical configuration.

Although not shown, the network device 10 also has a power supply, which may be a battery or a connection to a permanent power source, such as a wall outlet.

Figure 2:
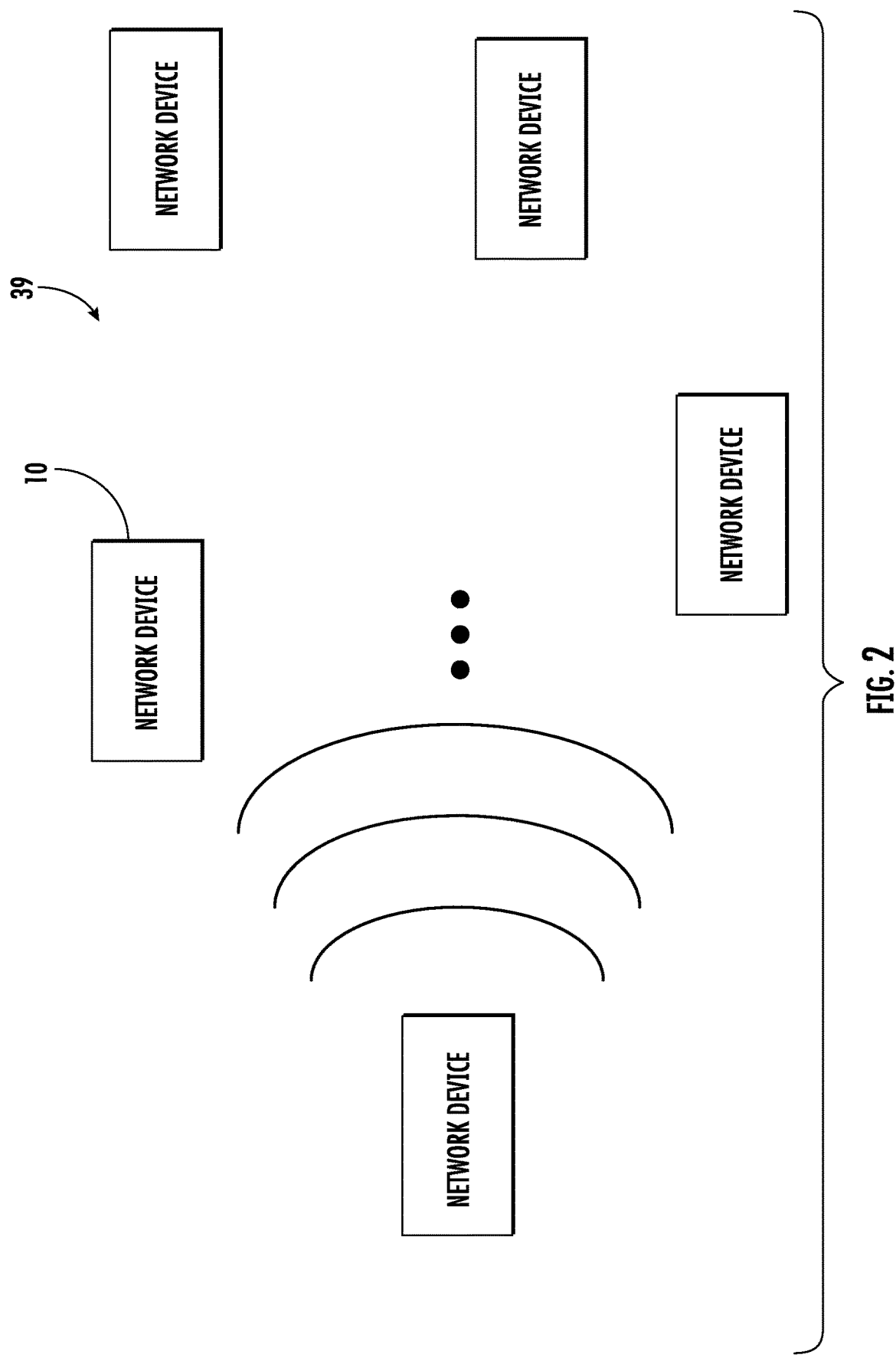
FIG. 2 shows a block diagram illustrating the distribution of a firmware patch file to a plurality of network devices.

FIG. 2 shows a network that includes one or more network devices 10, such as those shown in FIG. 1. This network may be a Bluetooth Mesh network. In this embodiment, the network protocol allows multicast messaging. In essence, network devices 10 may transmit messages to a particular address. This act may be referred to as publishing. Additionally, network devices 10 may choose to receive messages that are transmitted to a particular address. This act is referred to as subscribing. In this way, a plurality of network devices 10 may subscribe to a particular address and simultaneously receive packets sent to that address.

Additionally, in certain embodiments, a special protocol may be used to push firmware updates over an existing Bluetooth Mesh network to network devices 10 in the network in a multicast fashion. In other words, several identical network devices can be updated in a single transaction. Thus, a multicast firmware update utility can be efficiently used to update large networks of identical network devices, when compared to updating devices individually.

Thus, one network device may transmit a firmware update to an address. All network devices 10 that are eligible for this update may subscribe to this address.

While the Bluetooth Mesh protocol is described above, other wireless network protocols may benefit from the system and method described herein.

The system and method of compressing firmware updates exploits the fact that the new update and the previous version often are very similar. Thus, the present system and method analyzes the two versions for differences and creates a patch file that describes these differences.

Figure 3:
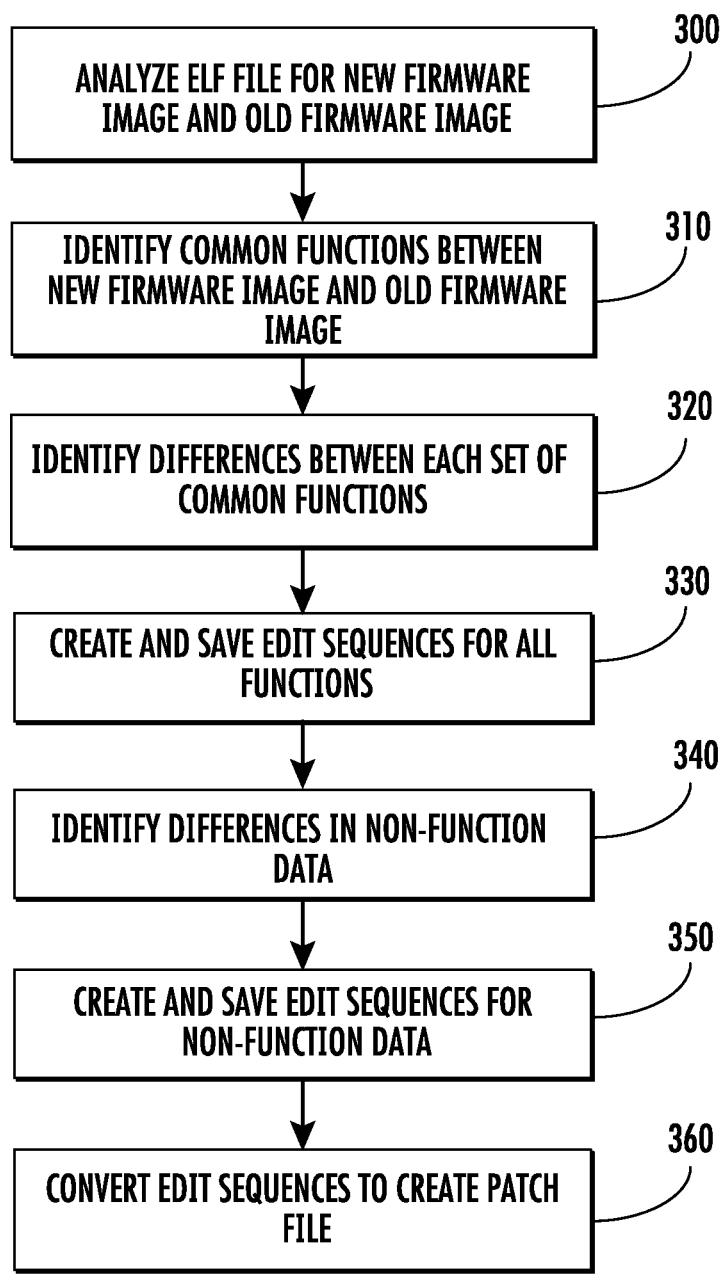
FIG. 3 shows a sequence of processes to create a firmware patch file according to one embodiment.

The mechanism of creating a patch file comprises a plurality of processes. The sequence of processes is shown in FIG. 3 and described below. The mechanism for applying that patch file will be described later.

The software to create the patch file may be referred as the patch creation software. This software may be resident on one of the network devices, such as those shown in FIG. 2. In other embodiments, the patch creation software may be resident on another device, such as a server or personal computer. In all of these embodiments, the patch creation software comprises instructions disclosed on a non-transitory storage medium that allows the processing unit on the device to perform the processes shown in FIG. 3. The patch creation software operates on two revisions of the firmware image; the old firmware image and the new firmware image.

First, it is important to note that firmware images typically comprise actual firmware code as well as other constant values. The terms "firmware image", "binary" and "binary file" are synonymous.

The firmware code is often divided into a plurality of functions, wherein each function performs a specific operation. When the code is compiled, an ELF (Executable Linkable Format) file is created. The ELF file includes a header, a program header table, the section header table, the actual code and any symbols. The ELF file may include function names and locations, the symbol names and locations as well as the attributes for all of the information.

In many cases, functions do not change significantly between revisions. For example, in some embodiments, jump locations in a function may change because of the addition or removal of instructions elsewhere in the firmware image. Further, in some embodiments, one or more instructions may be added or removed from the function. Thus, in many scenarios, the differences in a function between two revisions of firmware may be relatively small.

As shown in Box 300 of FIG. 3, in certain embodiments, the ELF sections in both files are enumerated and the sections that contribute to constructing a firmware image are read by the patch creation software. These ELF sections are typically the text section (program code) and data section (program data) but other sections such as a bootloader section or a firmware signature section may be present as well. Furthermore, sections which do not contribute to the construction of a firmware image but can provide data for analysis are read in. These typically include the symbol table and any debugging sections.

The sections containing program code are partitioned into ranges using primarily the symbol table information. Debugging information can also be used. Control flow and data flow analysis of program code can also be used to provide more information. The aim of the partitioning is to determine which parts of the sections are actual program code, which parts are read-only data, which parts are meaningless padding, and which parts are other data that needs to be preserved, as well as preparing to provide a mapping between ranges in the old firmware and ranges in the new firmware that represent the same entities (such as particular program functions).

Once the sections have been partitioned into ranges, and the role of each range is determined. the similarities between the old and the new firmware image are analyzed. This analysis can be done using multiple methods, including but not limited to:

Symbol table information (such as symbol names and symbol length, which is the number of bytes the symbol spans in the firmware image)

Hamming distance between regions of equal length of old and new firmware

Levenshtein distance, or some other edit distance, between regions of old and new firmware Longest common substrings between regions of old and new firmware Code structure analysis (basic block comparison) and data flow analysis for program functions in the old and new firmware. If two functions taking same inputs produce the same outputs, they are identical regardless of whether the sequences of instructions they are made out of are the same or not These techniques are described in more detail below.

As shown in Box 310 of FIG. 3, one process is to identify common functions between the two revisions of firmware. This may be performed in a number of ways. In certain embodiments, the patch creation software identifies a function name in the ELF file of the new firmware image. The patch creation software then attempts to find the same function name in the ELF file of the old firmware image. This process may be used when function names do not change between successive revisions of the firmware image.

In another embodiment, the patch creation software may use the ELF file to identify where the functions are located in the image. The patch creation software may then attempt to identify a function in the new firmware image. The patch creation software then analyzes all of the functions in the old firmware image, seeking the function that is most similar to the function in the new firmware image. In certain embodiments, the patch creation software calculates the Levenshtein edit distance between the function in the new firmware image and each function in the old firmware image. The function in the old firmware image with the smaller Levenshtein edit distance is assumed to be the same as the function in the new firmware image. In another embodiment, if the function lengths are the same, Hamming distance may be used to determine the function in the old firmware image that correspond to a function in the new firmware image.

Regarding of the technique used, this process (Box 310) is repeated for all of the functions in the new firmware image.

Note that if a new function has been added in the new firmware image, the process described above may incorrectly identify a function in the old firmware image as being the same function, since it has the smallest Levenshtein edit distance. However, this may be acceptable, as it still allows a compressed patch file to be created.

Once each function in the new firmware image has been matched with a function in the old firmware image, the differences between the functions can be identified, as shown in Box 320 of FIG. 310. First, a Wagner-Fischer matrix may be calculated between the function in the two firmware images. Once the matrix has been created, a sequence of individual edit steps may be determined. These edit steps are as follows:

No change in the data entity;

Addition of a new data entity;

Deletion of a data entity; and

Substitution of a data entity.

A data entity may be any desired size, such as a byte (8 bits); a 16-bit word; or a 32-bit word. In certain embodiments, the data entity may be assumed to be 16 bit words.

As a simple example, the edit sequence for turning the word "lemons" into the word "lemonade" would be as follows:

(no change for "l", no change for "e", no change for "m", no change for "o", no change for "n",
substitute "s" for "a",
add "d",
add "e")

This edit sequence can then compacted so that consecutive similar edits are collected into a group. For example, the edit sequence above could be compacted to:
(no change for "lemon",
substitute "s" for "a",
add "de")

Thus, in the best case, where the function is unchanged in the new firmware image, the edit sequence is simply a no change edit spanning the entire function.

In the worst case, the function does not exist in the old firmware image. In this case, the edit sequence would be an add edit sequence that comprises the entirety of the new function.

In other embodiments, the new function is generated using substitute, add and/or delete edit sequences.

As noted above, in certain embodiments, the only changes in a function may be jump destination addresses. In these embodiments, the edit sequence may comprise a set of no change edits interleaved with substitution edits.

More complex changes may result in all four type of edits.

The patch creation software may then save all of the edit sequences that were created, as shown in Box 330 of FIG. 3.

Next, as shown in Box 340 of FIG. 3, the patch creation software may attempt to identify differences in regions of the firmware image that are not functions. For example, the firmware image may include regions that include padding, object symbols, read only data, and other binary data. Each of these types of information will be described below.

Padding bytes may be easily handled by recording an edit sequence for adding a number of null (zero value) bytes, or, in case both the old and the new version of the symbol being padded has the same amount of padding bytes, they can be considered a part of the symbol contents even if technically speaking they are not. If the number of padding bytes is different between the two firmware images, edit sequences that include "add" or "delete" may be used.

Object symbols may be treated as follows. First, as described above, the ELF file may include links to all symbols in the firmware image. Thus, the patch creation software may analyze the ELF file for the new firmware image and the ELF file for the old firmware image to locate each symbol. These symbols can then be compared, such as by using the techniques described above. Thus, a Wagner/Fisher Matrix may be created and the edit sequence may be created from this matrix.

Read only data and other binary data may be handled in a similar fashion. Read only data and other binary data are typically regions within the firmware image that are not referenced by the symbol table. This data without any symbol information will likely have large regions that match exactly with similar data in the old firmware image.

Finding substring matches using any well known method for finding longest common substrings (LCS) between the new and old firmware images can be used to locate similarities.

In one embodiment, finding these similarities falls into a divide-and-conquer pattern. Assume that the old firmware image string is named O while the binary data region under consideration in the new firmware image can be named N. The patch creation software can proceed as follows:
First find the LCS between O and N; L=LCS(O, N)

If there was no L, the process is complete; (N needs to be added as new data)

If L==N, the process is complete; (N can be a copy edit sequence from the old data)

Otherwise, remove L from N. This falls into one of three possible conditions:
If N starts with L, N becomes what remains after prefix L is removed
If N ends with L, N becomes what remains after suffix L is removed
Otherwise, if L is in the middle of N, the patch creation software needs to consider two substrings of N, the part preceding L and the part following N.

Repeat the procedure for the one or two substrings of N

There will always be an edit sequence as a result of LCS matching. LCS matching may not be ideal for all cases, for instance, since LCS does not handle substitutions in otherwise identical data. For example, LCS matching does not efficiently handle the scenario where "abcdeFgHijkl" is replaced by "abcdefghijkl". In this scenario, LCS matching would identify "abcde", but would look to match "F" further in the text, creating a complicated patch file. An edit sequence from such a case easily becomes an unnecessarily complex chain of fragments.

Alternatively, it can be determined that a block of data in the old firmware image is the same length as a corresponding block of data in the new firmware image. This may be performed by checking if, in both ELF files, there is a section of matching size. If the blocks are the same length, the patch creation software may instead determine if the Hamming edit distance between the two blocks is small. If so, it can well be beneficial to record the difference as an edit sequence that contains substitutions for the changes and no-change edit steps for the identical parts. In other embodiments, this is not performed. If the Hamming edit distance is large, the patch creation software may opt to simply substitute the entire block of data.

Further, if LCS matching of a block of data does not produce adequate results, for example, if there are no substrings that are long enough to generate meaningful compression, the patch creation software may opt to simply substitute the entire block of data.

Thus, using these techniques, the patch creation software may determine the edit sequences for all non-function data, as shown in Box 350 of FIG. 3.

The previous description discloses a system and method to detect differences between two firmware images and create edit sequences that completely describe these differences.

Next, as shown in Box 360 of FIG. 3, the patch creation software creates the patch file that is to be applied, using the edit sequences that were created as described above. The patch file comprises a plurality of opcodes, each with an associated parameter. In creating these opcodes, several observations were made. These observations are noted below:
Program code makes up the bulk of the firmware binary
Within program code, functions with changed jump destinations are most common
Functions without any changes except perhaps relocations are common as well
Any other change is much rarer
Program data makes up the lesser portion but may be worth optimizing
Unchanged parts make up the bulk of the program data
Based on these observations, the opcodes used in the patch file may be optimized.

In addition, it is noted that functions with changed jump destinations are very common. For example, a function is shown in FIG. 4A. This function is used to initialize an application. As such, it loads values into select registers and then jumps to another function, known as GPIO PinMode-Set, twice. This function also jumps to a function known as configEnablePti.

FIG. 4B shows the binary representation of this function in the old firmware image. FIG. 4C shows the binary representation of this function in the new firmware image.

Note that the two function are very similar, except for jump locations. Specifically, location 0x00bab8 changes from 0xfdbd to 0xfda7; location 0x00bac4 changes from 0xf949 to 0xf937 and location 0x00bad4 changes from 0xb941 to 0xb92f.

This type of modification is common, and therefore, the opcodes used for the patch file may be optimized for these types of modification. For example, while the value at location 0x00bab8 changes to fda7 (a 16 bit entity), it is very similar to the previous value (i.e., 0xfdbd−0xfda7=0x16). Note that the difference is only an 8 bit entity. Thus, in certain embodiments, in addition to a replace (or substitute) edit sequence, there may be a difference edit sequence, where the new value is equal to the old value plus (or minus) an offset.

The following is a list of opcodes that may be implemented to create the patch file. These may include:
  SUBST
  DIFF
  ADD
  COPY
  DEL
  SKIP; and
  SET These opcodes, or a subset of these opcodes, may be used to create the patch file. Each is described in more detail below.

SUBST is used to replace one or more data entities from the old firmware image with new values. These new values may be included as parameters immediately following the opcode. In another embodiment, the patch file may include a dictionary that stores various entries that can be used by the opcodes. For example, the parameter associated with the SUBST opcode may be a pointer into the dictionary. The entry at that location in the dictionary is the string of values that should be used to replace the values in the old firmware image. The length of the string in the dictionary can be determined using a variety of methods, as described in more detail below. In yet another embodiment, all data that is to be substituted is stored in one contiguous region of data. In this embodiment, the parameter following the opcode may indicate the number of data entities from the region of data that are to be substituted. The system may also maintain a pointer to the next data entity in the region that is to be used. Thus, after a SUBST opcode is executed, the system moves the pointer to point to a different data entity in the region. Optionally, the contiguous region of data may be compressed.

DIFF is a variation of SUBST. However, instead of replacing the value in the old firmware image with a new value, the value is replaced by a value that is defined relative to the old value. For example, assume that the value in the old firmware image was 0x20 and the new value is to be 0x36. Using a SUBST opcode, the parameter that follows the opcode would be 0x36 (i.e., the new value). Using the DIFF opcode, the parameter that follows the opcode would be 0x16 (i.e., the difference between the old value and the new value). This opcode may be beneficial for jump instructions where the jump destination addresses have been modified, because the difference between the two jump destination addresses is typically smaller than the actual value of the jump destination address. Additionally, if the function has a plurality of jump instructions, the likelihood that the difference between the old destination and the new destination for these jump instructions is identical is much higher than if absolute addresses were used. This allows a single dictionary entry to be used for multiple instances.

ADD is used to insert one or more data entities into the new firmware image. These new data entities may be included as parameters immediately following the opcode. In another embodiment, the patch file may include a dictionary that stores various entries that can be used by the opcodes. For example, the parameter associated with the ADD opcode may be a pointer into the dictionary. The entry at that location in the dictionary is the string of values that should be added to the new firmware image. In yet another embodiment, as described above, all data that is to be added may be stored in one contiguous region of data. In this embodiment, the parameter following the opcode may indicate the number of data entities from the region of data that are to be added. The system may also maintain a pointer to the next data entity in the region that is to be used. Optionally, the contiguous region of data may be compressed. In certain embodiments, data used for substitutions and data used for additions may be stored in the same contiguous region of data.

COPY is used to copy one or more data entities from the old firmware image into the new firmware image. The number of data entities that are to be copied may be a parameter immediately following the opcode.

DEL is used to remove one or more data entities from the old firmware image. The number of data entities that are to be deleted may be a parameter immediately following the opcode.

SKIP may be a special variation of ADD, where the value to be added is zero. In this case, the parameter that the follows the opcode may indicate the number of data entities that are to be added. This may be beneficial to pad the new firmware image.

SET may be used to manipulate the pointer associated with the old firmware image. For example, as the new firmware image is being created, there are two pointers; one associated with the new firmware image (i.e., a pointer to where the new data is to be written) and one associated with the old firmware image (i.e., a pointer to where the old data is to be read from). Each of the above opcodes manipulates at least one of these pointers.

For example, the SUBST opcode advances both pointers by a value equal to the number of data entities that are to be substituted. Likewise, the DIFF and COPY opcodes advance both pointers by the same value. The ADD opcode increments the pointer associated with the new firmware image but does not affect the pointer associated with the old firmware image. Similarly, SKIP increments the pointer associated with the new firmware image but does not affect the pointer associated with the old firmware image. Conversely, the DEL opcode increments the pointer associated with the old firmware image but does not affect the pointer associated with the new firmware image. The SET opcode is used to manipulate the pointer associated with the old firmware image without affecting the pointer associated with the new firmware image.

For example, the SET opcode may be used to avoid copying data from the old firmware image when this data has been deleted by simply moving the pointer past the data entities to be deleted. For example, assume that the old firmware image includes the string "the quick brown fox" and the new firmware image is to include "the quick fox". The SET opcode may be used as follows:
COPY (9) (i.e., "the quick");
SET (+6) (i.e., skip over "brown");
COPY (3) (i.e., "fox").

Thus, in certain embodiments, the use of the SET opcode may render the DEL opcode redundant.

The SET opcode can also be used when data in the new firmware image is reordered from the old firmware image. Using the above example, assume that the new firmware image is to include "the brown quick fox". The SET opcode may be used as follows:
COPY (4) (i.e., "the");
SET (+6) (i.e., skip over "quick");
COPY (6) (i.e., "brown");
SET (−12) (i.e., return pointer to "quick");
COPY (6) (i.e., "quick");
SET (+6) (i.e., skip over "brown"); and
COPY (3) (i.e., "fox").

As described earlier, in some embodiments, a dictionary may be used. A dictionary is a list of entries that contains values that may be used by the opcodes. For example, if a function has been relocated with N bytes, some or all of its jump destination addresses may be changed by N bytes. Thus, rather than using the actual jump destination address in a plurality of SUBST commands, it may be more space efficient to define a dictionary entry that includes the new jump destination address and have each SUBST opcode refer to this dictionary entry.

The dictionary may be organized in several ways. In one embodiment, each pointer that is contained in an instruction is used to index into a list of addresses, where each address is a fixed length. For example, assume that each address is 4 bytes long. In this way, the pointer in the instruction serves as the index into this list. For example, the value of the pointer may be multiplied by 4 (since each address is 4 byes long) and added to the starting address of the dictionary. The 4 byte value at that location is the address of the entry in the dictionary.

In another embodiment, the dictionary is organized according to the length of each entry. For example, a first number of entries may be reserved for values that are 2 bytes long. A second number of entries may be reserved for values that are 4 bytes long. If the first and second number are known, then the software can readily convert an entry number into an actual address.

Referring back to FIGS. 4B and 4C, two versions of a function are shown. The patch file to create this new version from the old version may be as follows:
COPY(2) <<copy two data entities (4 bytes)>>
DIFF(−0x016) <<replace 0xfdbd with 0xfda7>>
COPY(5) <<copy five data entities>>
DIFF(−0x012) <<replace 0xf949 with 0xf937>>
COPY(7) <<copy five data entities>>
DIFF(−0x012) <<replace 0xb941 with 0xb92f>>

Note that in this example, two of the substitutions require the same difference value (i.e. −0x012). Thus, in some embodiments, it may be advantageous to create a dictionary entry with this value and have the DIFF opcode point to this entry. For example, if dictionary entries are used for DIFF opcodes, the patch file above may be rewritten as:
COPY(2) <<copy two data entities (4 bytes)>>
DIFF(@1) <<replace 0xfdbd with 0xfda7>>
COPY(5) <<copy five data entities>>
DIFF(@2) <<replace 0xf949 with 0xf937>>
COPY(7) <<copy five data entities>>
DIFF(@2) <<replace 0xb941 with 0xb92f>>

In this example, the first entry in the dictionary (i.e., @1) is −0x016 and the second entry (i.e., @2) is −0x012. Assuming that each dictionary entry is used more than once, this technique may be more space efficient than using the actual values as the parameters.

Having defined a number of opcodes that can be used to create a patch file, the next step is the create the encoding for these opcodes. Specifically, it may be beneficial to encode some of the most commonly used opcodes as 1 byte instructions. Less used opcodes may be encoded as two byte or more instructions.

A study of several firmware revisions empirically found that copy and substitutions (in the form of differences) may be the most commonly used edit sequences.

Thus, in one embodiment, the patch creation software utilizes two variants of the COPY and DIFF opcodes may be employed. For example, one variant of the COPY instruction may be one byte in length and may be used to copy up to 64 data entities. A second variant of the COPY instruction may be more bytes in length and may be used to copy in excess of 1000 data entities.

Similarly, there may be 1 byte variant of the DIFF instruction that may index into the first 64 or 128 entries in the dictionary. A second variation of the DIFF instruction may be two bytes in length and index into the first 2048 entries of the dictionary.

In one embodiment, the following opcodes may be utilized:
COPY (short variation)
COPY (long variation)
DIFF (short variation)
DIFF (long variation)
ADD
SUBST
SET
SKIP In certain embodiments, the length of each opcode is determined based on its frequency of occurrence in the patch file. For example, COPY and DIFF opcodes may be very common and therefore may have the shortest opcode lengths. In certain embodiments, the shortest opcode length may be one byte. However, it is possible to have shorter opcode lengths, such as fractional bytes, if desired.

Thus, once the patch creation software has finished, the result will be the patch file that is needed to transform the old firmware image into the new firmware image.

The patch file includes the set of instructions, which are made up of opcodes and associated parameters. The patch file may also include the dictionary. In some embodiments, the patch file may include a contiguous region of data, as described above.

In certain embodiments, the patch file may be compressed using a generic compression algorithm to further reduce its size. Once the patch file is created and optionally compressed, it may be transmitted to other network devices. In one embodiment, the patch is created on a computer, different from those shown in FIG. 2. This computer may be a personal computer, a laptop computer, a server or any other suitable device. Further, this computer may include a processing unit and an associated memory, wherein the instructions to create the patch are disposed within the associated memory. Once the computer creates the patch file, it is delivered to one of the network devices in that network. That network device then utilizes a firmware update utility to multicast the new patch file to the other network devices.

Each network device includes a software program, referred to as the patch program. The patch program uses the patch file that was transmitted in conjunction with the current firmware image to create the new firmware image.

Figure 5:
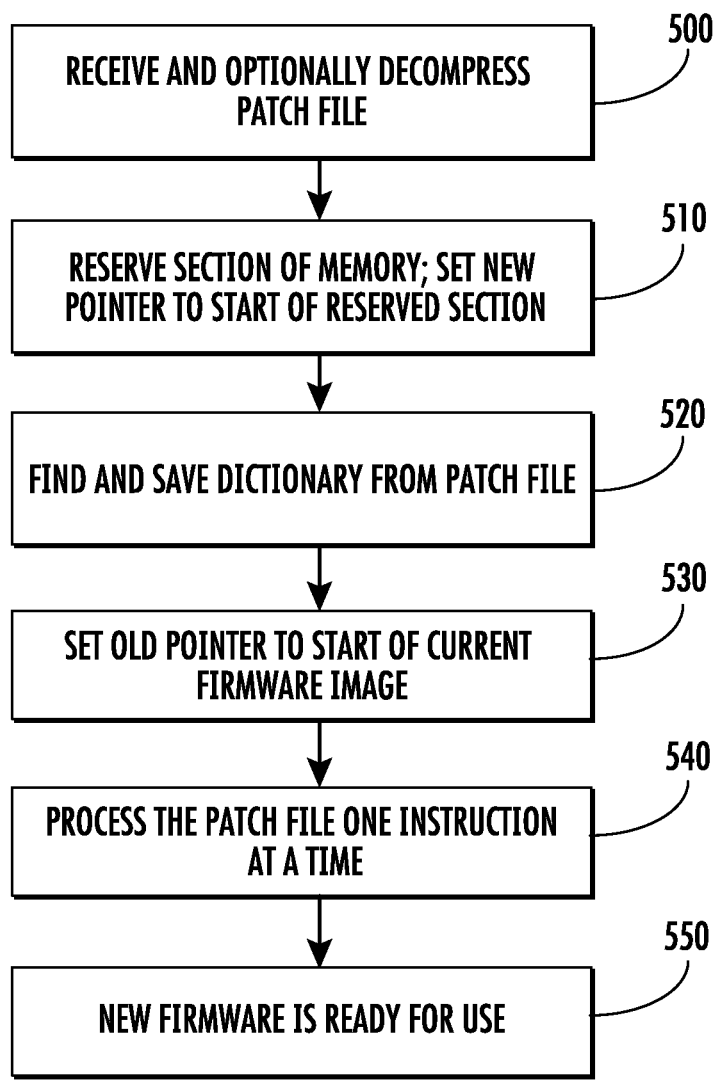
FIG. 5 shows a sequence of processes to apply a firmware patch file according to one embodiment.

The process of applying the patch file is described in FIG. 5. First, as shown in Box 500, the patch program receives the patch file. If the patch file was previously compressed by the computer, the patch file is first decompressed.

As shown in Box 510, the patch program reserves a section of memory that is large enough to hold the new firmware image. The starting address of this section of memory is saved as the new pointer.

The patch program then finds the dictionary of commonly used values from the patch file and saves it in memory, as shown in Box 520.

In another embodiment, the patch program may find the contiguous region of data and save it to memory.

The patch program then sets a second pointer, referred to as old pointer to the start of the current firmware image, as shown in Box 530.

The patch program then begins the process of creating the new firmware image, as shown in Box 540.

If the opcode is a COPY opcode (either short or long variation), the patch program determines the number of data entities that are to be copied. The patch program then copies this number of data entities starting at the address indicated by the old pointer and stored them at the address indicated by the new pointer. The patch program then advances both pointers by this number.

If the opcode is a DELETE opcode, the patch program determines the number of data entities that are to be deleted. The patch program then increments the old pointer by this value. No change is made to the new pointer.

If the opcode is an ADD opcode, the patch program determines the number and value of the data entities that are to be added. The patch program then adds these new data entities to the memory indicated by the new pointer. The new pointer is incremented by this number, while the old pointer is unaffected. In certain embodiments, the data entities to be added may be list immediately following the opcode. In another embodiment, the data entities to be added may be included in the dictionary and the parameter following the opcode represents a pointer to this entry in the dictionary. In another embodiment, the data entities to be added may be stored in the contiguous region of data and the parameter following the opcode may be an indication of the number of data entities to be added.

If the opcode is a SKIP opcode, the patch program determines the number of zeros that are to be added. This number of zero may be included as the parameter following the opcode. The patch program then added these zeros to the memory indicated by the new pointer. The new pointer is incremented by this number, while the old pointer is unaffected.

If the opcode is a SET opcode, the patch program sets the old pointer to the value indicated by the instruction. No change is made to the new pointer.

If the opcode is a SUBST or DIFF opcode, the patch program determines the number of data entities to be substituted or replaced. It then writes the new data into the memory indicated by the new pointer. The old pointer is advanced by the same number. In some embodiments, the new data may be stored in the dictionary at a location indicated by a parameter following the opcode in the SUBST or DIFF instruction. In other embodiments, the new data is stored in the contiguous region of data and the parameter following the opcode indicates the number of data entities that are to be replaced.

This process is repeated until the entirety of the patch file has been processed.

The new firmware image is now ready for use, as shown in Box 550.

The present system and method have many advantages. As described above, the purpose of this process is to create smaller patch files. To test the efficiency of this new system and method, several tests were performed. Specifically, four versions of a firmware image that is operable on the network devices were considered. The table below shows the size the patch generated when converting the old firmware image to the new firmware image. As a comparison, the size of the patch file generated by bsdiff is also shown.

| Old image | New image | Bsdiff patch size | Patch size | Percent reduction |
| --- | --- | --- | --- | --- |
| 0 | 1 | 23,149 | 20,971 | 9.5% |
| 0 | 2 | 31,065 | 29,449 | 5.2% |
| 0 | 3 | 31,041 | 29,895 | 3.7% |
| 1 | 2 | 28,017 | 26,745 | 4.5% |
| 1 | 3 | 27,804 | 26,912 | 3.2% |
| 2 | 3 | 19,513 | 18,052 | 7.5% |

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of creating a patch file that transforms an old firmware image into a new firmware image, comprising:
    analyzing an ELF (Executable Linkable Format) file associated with the new firmware image to identify functions within the new firmware image;
    matching a function in the new firmware image with a corresponding function in the old firmware image based on edit distance;
    identifying differences between the function in the new firmware image and the corresponding function in the old firmware image;
    creating an edit sequence based on the differences, wherein, when the edit sequence is executed on the function in the old firmware image, the edit sequence transforms the function in the old firmware image into the function in the new firmware image;
    converting edit sequence to a set of opcodes, each opcode comprising at least one parameter; and
    repeating the matching, identifying, creating and converting steps for each function in the new firmware image.

2. The method of claim 1, wherein matching the function comprises:

finding a Levenshtein edit distance between the function in the new firmware image and each function in the old firmware image; and selecting a function in the old firmware image having the shortest Levenshtein edit distance.

3. The method of claim 1, wherein matching the function comprises:

determining a Hamming distance between the function in the new firmware image and all functions in the old firmware image having a same length; and selecting a function in the old firmware image having the shortest Hamming distance.

4. The method of claim 1, wherein creating the edit sequence comprises:

calculating a Wagner-Fischer matrix between the function in the new firmware image and the corresponding function in the old firmware image; and creating a sequence of edit steps based on the matrix.

5. The method of claim 4, wherein the edit steps comprise one or more of: no change, add, substitute, and delete.

6. The method of claim 1, wherein the set of opcodes comprises one or more of: substitute (SUB), add (ADD), skip (SKIP), delete (DEL), set (SET), diff (DIFF), and copy (COPY).

7. The method of claim 6, wherein the DIFF opcode replaces a data entity in the old firmware image with a new value, that is defined relative to the data entity in the old firmware image.

8. The method of claim 6, wherein opcode length is determined based on frequency of occurrence in the patch file.

9. The method of claim 6, wherein the SKIP opcode includes one parameter, wherein the parameter indicates a number of zeros to be inserted in the patch file.

10. The method of claim 1, further comprising locating, in the new firmware image, regions that is not functions, the regions including padding, object symbols, read only data, and other binary data.

11. The method of claim 10, wherein the ELF files are used to locate an object symbol in the new firmware image and a corresponding object symbol in the old firmware image, and wherein the object symbol and corresponding object symbol are compared to identify differences and the differences are used to create the edit sequence.

12. The method of claim 10, wherein read only data and other binary data is compared by finding longest common substrings (LCS) to locate similarities, and wherein the longest common substrings are used to create edit sequences, and wherein the edit sequences are converted to the set of opcodes.

13. The method of claim 10, wherein a length of the read only data and other binary data in the new firmware image is compared to a length of the read only data and other binary data in the old firmware image and if the lengths are identical, a Hamming edit distance is determined, and wherein if the Hamming edit distance is small, an edit sequence is generated.

14. The method of claim 13, wherein if the Hamming edit distance is large, an entirety of the read only data and other binary data is substituted in the patch file.

15. The method of claim 1, wherein the patch file further comprises a dictionary comprising a plurality of entries, and wherein the at least one parameter that follows one or more of the opcodes in the set of opcodes is used to access an entry in the dictionary.

16. The method of claim 15, wherein the at least one parameter comprises a pointer to index into a list of addresses, and wherein the addresses are used to identify a location within the dictionary.

17. The method of claim 15, wherein the dictionary is organized according to a length of each entry such that a first number of entries are reserved for values that are a first length and a second number of entries are reserved for values that are a second length.

18. The method of claim 1, wherein the old firmware image is disposed on a memory device of a network device, and the patch file is to be transmitted to the network device.

19. A method of updating a firmware image on a network device, wherein the memory of the network device contains an old firmware image, comprising:

creating a patch file, using the method of claim 1;

transmitting the patch file to the network device; and using a processing unit on the network device to use the patch file to transform the old firmware image into the new firmware image.

* * * * *